United States Patent [19]
Yamada et al.

[11] Patent Number: 5,379,265
[45] Date of Patent: Jan. 3, 1995

[54] SEMICONDUCTOR MEMORY DEVICE HAVING VARIABLE PRECHARGING PERIOD

[75] Inventors: Yukinori Yamada; Yumi Kurokawa, both of Kanagawa, Japan

[73] Assignee: NEC Corporation, Toyko, Japan

[21] Appl. No.: 190,380

[22] Filed: Feb. 2, 1994

[30] Foreign Application Priority Data

Feb. 5, 1993 [JP] Japan .................................. 5-018310

[51] Int. Cl.6 .............................................. G11C 8/00
[52] U.S. Cl. .................................. 365/233.5; 365/203
[58] Field of Search ................ 365/233.5, 203, 189.11, 365/189.09, 189.07, 202, 233

[56] References Cited

U.S. PATENT DOCUMENTS 4,712,197  12/1987  Sood ............................... 365/233.5
4,872,143  10/1989  Sumi .............................. 365/233.5

Primary Examiner—Eugene R. LaRoche
Assistant Examiner—A. Zarabian
Attorney, Agent, or Firm—Sughrue, Mion, Zinn, Macpeak & Seas

[57] ABSTRACT

A selected static type random access memory cell changes associated bit lines between a positive high voltage level and a ground voltage level in a write-in sequence and between the positive high voltage level and a middle voltage level in a read-out sequence, and a timing controller monitors the bit lines for producing an enable signal supplied to a word line driving unit and for canceling a precharge controlling signal supplied to a pull-up/balancing unit upon arrival of either bit line at the middle voltage level, thereby preventing the static type random access memory cell from connection with the associated bit lines with a large potential difference.

9 Claims, 6 Drawing Sheets

SEMICONDUCTOR MEMORY DEVICE HAVING VARIABLE PRECHARGING PERIOD

FIELD OF THE INVENTION

This invention relates to a semiconductor memory device and, more particularly, to a semiconductor memory device having a variable precharging operation for perfectly canceling a potential difference on a bit line pair.

DESCRIPTION OF THE RELATED ART

A typical example of the semiconductor memory device is illustrated in FIG. 1 of the drawings. The semiconductor memory device comprises a plurality of memory cells M1 and M2, and a bit line pair BLa and BLb is coupled with a pair of input nodes of each memory cell M1 and M2. Although only one column of memory cells M1 and M2 is illustrated in FIG. 1, the column of memory cells M1 and M2 form a part of a memory cell array.

The control nodes of the memory cells M1 and M2 are respectively coupled with word lines WL1 and WL2, and word line drivers 1 and 2 selectively energize the word lines WL1 and WL2 in response to row address decoded signals. Either memory cell M1 or M2 coupled with the energized word line is conducted with the bit line pairs BLa and BLb, and a data bit in the form of potential difference is transferred between a pair of memory nodes of the selected memory cell and the bit line pair BLa and BLb.

The prior art semiconductor memory device further comprises a read/write circuit 3 responsive to a write enable signal WE for changing between a write-in mode and a read-out mode, and a data bit is transferred through the read/write circuit 3 between the bit line pair BLa and BLb and the outside thereof.

A pull-up balance 4 is coupled with the bit line pair BLa and BLb, and is responsive to a one-shot address transition detecting signal ATD of active low voltage level for pulling up and balancing the bit lines BLa and BLb. An address transition detecting circuit 5 monitors address bits, and produces the one-shot address transition detecting signal ATD upon an address transition.

A pair of p-channel type load transistors Qp1 and Qp2 are connected between a positive power voltage line Vdd and the bit lines BLa and BLb, and the ground voltage level is applied to the gate electrodes of the p-channel type load transistors Qp1 and Qp2. The p-channel type load transistors Qp1 and Qp2 prevents the bit lines BLa and BLb from undershoot on either bit line in the read-out sequence. In this instance, the p-channel type load transistors Qp1 and Qp2 do not allow the bit line BLa or BLb to become under the predetermined voltage level 0.2 volt lower than the positive power voltage level Vdd.

Description is hereinbelow made on a write-in sequence and a read-out sequence with reference to FIG. 2. First, the write enable signal WE goes down at time t1, and the semiconductor memory device enters into the write-in mode. The address bits are changed, and the address transition detecting circuit 5 acknowledges the address transition.

The address transition detecting circuit 5 produces the one-shot address transition detecting signal ATD at time t2, and the pull-up balance 4 charges the bit line pair BLa and BLb while the address transition detecting circuit 5 is keeping the one-shot address transition detecting signal ATD in the low voltage level. As a result, the bit lines BLa and BLb are balanced at the positive high voltage level Vdd at time t3.

upon the balance at the high voltage level, the read/write circuit 3 supplies a potential difference indicative of a write-in data bit to the bit line pair BLa and BLb, and one of the bit lines BLa and BLb starts to decrease the potential to the ground voltage level.

The row address decoded signals are assumed to select the word line WL1, and the word line driver 1 starts to energize the word line WL1 at time t4. The memory cell M1 couples the pair of memory nodes thereof with the bit line pair BLa and BLb, and transfers the potential difference indicative of the write-in data bit to the pair of memory nodes.

Assuming now that the write enable signal WE rises to the high voltage level at time t11, the address bits concurrently change the address, and the address transition detecting circuit 5 produces the one-shot address transition detecting signal ATD at time t12. The pull-up balance 4 charges the bit lines BLa and BLb, and balances them at the positive high voltage level Vdd at time t12.

The row address decoded signals is assumed to select the word line WL2, and the word line driver 2 energizes the word line WL2. Then, the word line WL2 starts to rise toward the high voltage level, and the memory cell M2 couples the pair of memory nodes with the bit line pair BLa and BLb. The potential difference on the memory nodes is transferred to the bit line pair BLa and BLb at time t14, and the read/write circuit 3 produces an output data signal indicative of the read-out data bit from the potential difference on the bit line pair BLa and BLb.

Thus, while the address transition detecting circuit 5 is keeping the one-shot address transition detecting signal ATD in the low voltage level, the pull-up balance 4 equalizes the bit lines BLa and BLb at the positive high voltage level in both write-in and read-out sequences.

However, a problem is encountered in the prior art semiconductor memory device in that a data bit stored in the memory cell is liable to be destroyed in the read-out sequence immediately after the change from the write-in mode to the read-out mode.

SUMMARY OF THE INVENTION

It is therefore an important object of the present invention to provide a semiconductor memory device which is free from a data destruction.

The present inventor contemplated the problem inherent in the prior art semiconductor memory device, and concluded that a potential difference was left between bit lines due to shortage of current driving capability of a pull-up balance upon transition from a write-in sequence to a read-out sequence.

To accomplish the object, the present invention proposes to prolong a one-shot address transition detecting signal if a potential difference is left between bit line pairs.

In accordance with the present invention, there is provided a semiconductor memory device selectively entering into a write-in mode and a read-out mode, comprising: a) a memory cell array having a plurality of memory cells each storing a data bit in the form of potential difference; b) a plurality of bit line pairs selectively associated with the plurality of memory cells, and connected with data transfer node pairs of the associated memory cells, each of the plurality of bit line pairs having a first bit line and a second bit line; c) a plurality of word lines selectively associated with the plurality of memory cells, and connected with control nodes of the associated memory cells; d) a word line driving unit connected with the plurality of word lines, and enabled with an enable signal for energizing one of the plurality of word lines, thereby allowing data bits in the form of potential difference to be transferred between the plurality of bit line pairs and the memory cells coupled with the one of the plurality of word lines; e) a read/write circuit connectable with one of the plurality of bit line pairs, and supplying a potential difference indicative of a write-in data bit to the one of the plurality of bit line pairs in the write-in mode, a high voltage level and a low voltage level forming the potential difference indicative of the write-in data bit, the read/ write circuit producing an output data signal indicative of one of the data bits read out from the memory cell array in the read-out mode, the high voltage level and a middle voltage level forming the potential difference indicative of the one of the data bits; f) a precharging means responsive to a precharge control signal for charging the plurality of bit line pairs to the high voltage level, the precharging means being further operative to keep either first or second bit line of each bit line pair at the middle voltage level in the read-out mode after the one of the word lines is energized; and g) a timing control means activated in a transition period after an address transition, and monitoring the plurality of bit line pairs to see whether or not the precharging means causes the first bit lines and the second bit lines to exceed the middle voltage level in at least the read-out mode for producing the enable signal and the precharge control signal, the enable signal being produced when either first or second bit line of each bit line pair exceeds the middle voltage level after the address transition, the precharging control signal being canceled when either first or second bit line of each bit line pair exceeds the middle voltage level after the address transition.

BRIEF DESCRIPTION OF THE DRAWINGS

The feature and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
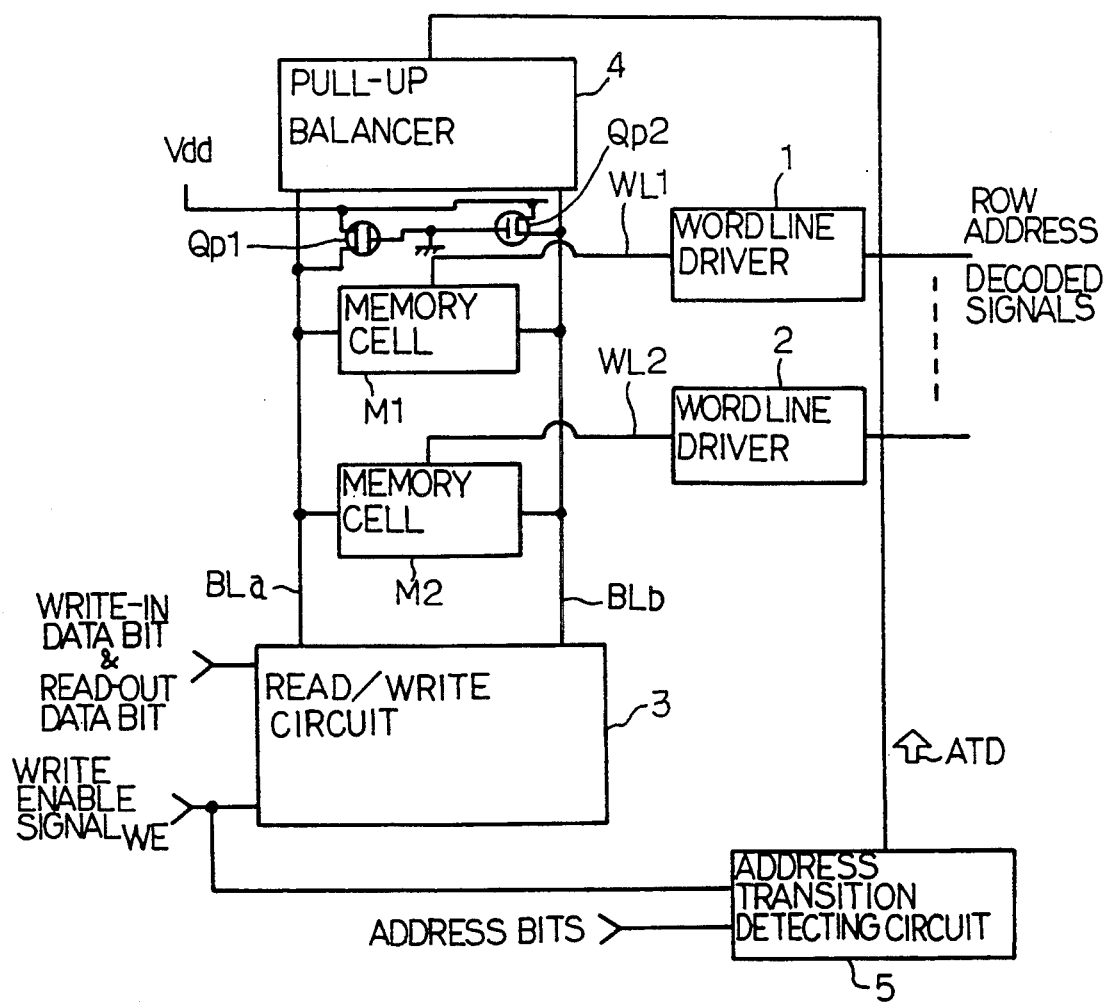
FIG. 1 is a block diagram showing the circuit arrangement of the prior art dynamic random access memory device.
Figure 2:
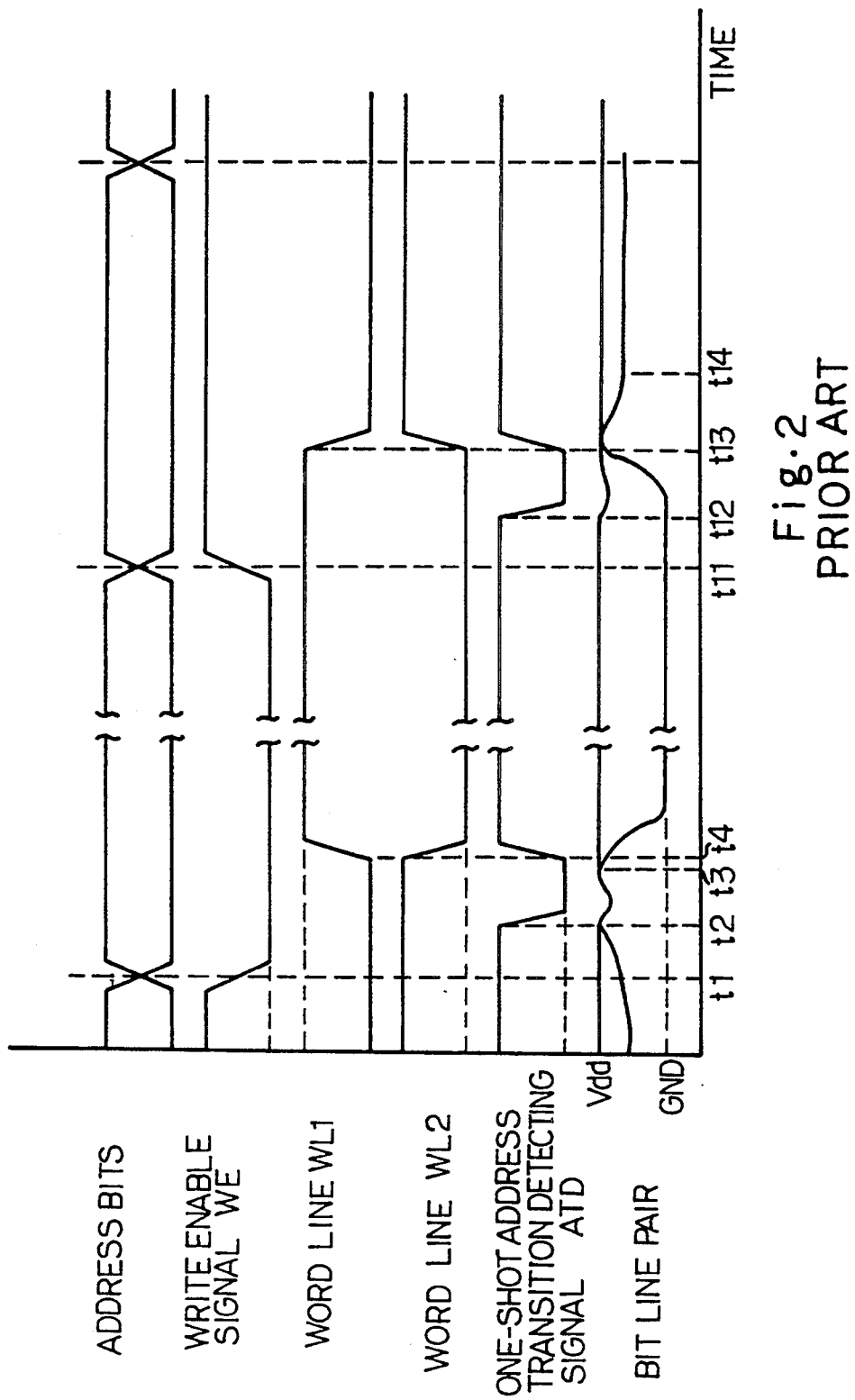
FIG. 2 is a timing chart showing the write-in sequence and the read-out sequence carried out by the prior art semiconductor memory device.
Figure 3:
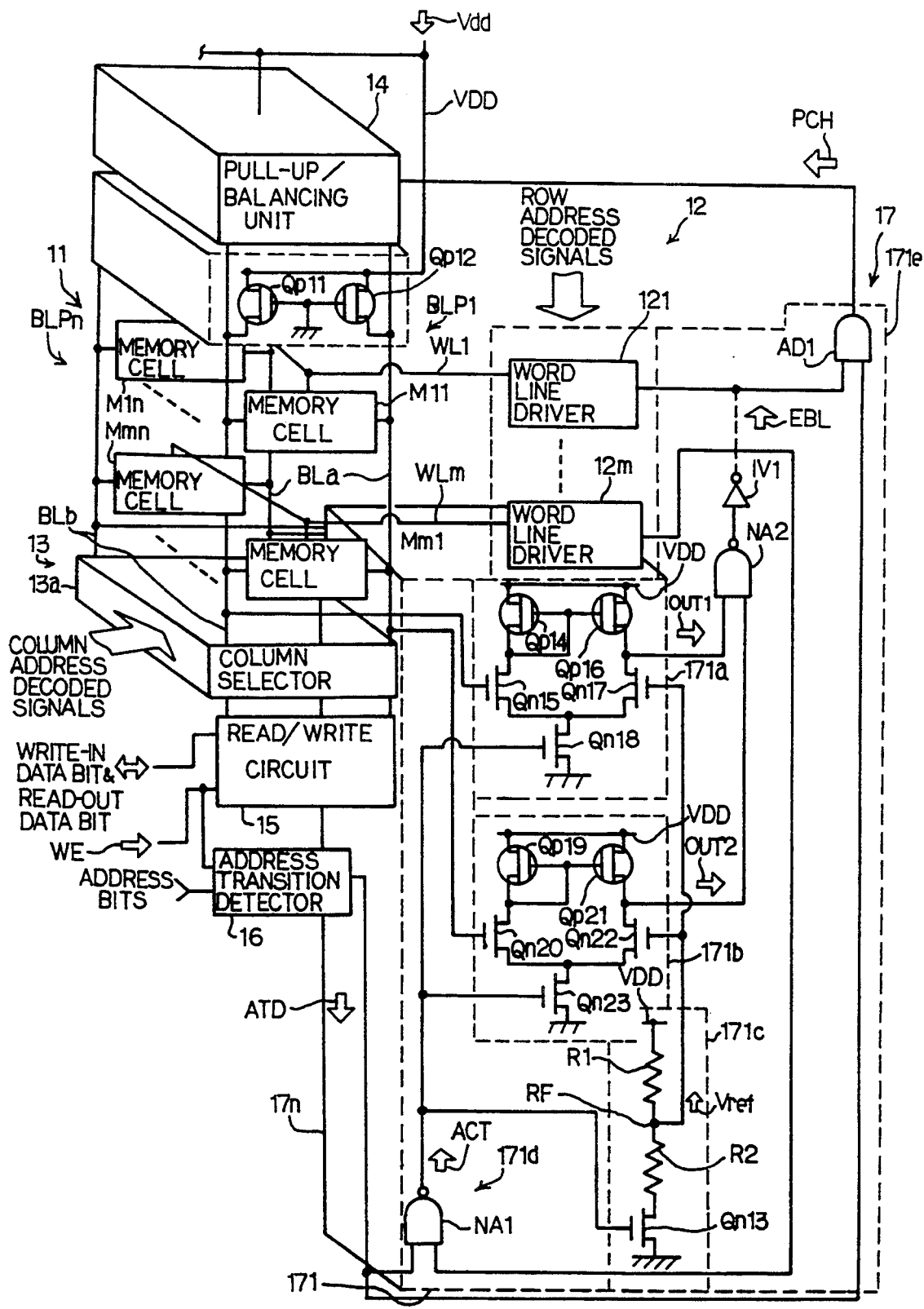
FIG. 3 is a circuit diagram showing the circuit arrangement of a semiconductor memory device according to the present invention.

Referring to FIG. 3 of the drawings, a semiconductor memory device embodying the present invention is fabricated on a single semiconductor chip, and selectively enters into a write-in mode and a read-out mode of operation. In the following description, logic "1" level and logic "0" level are assumed to be equivalent to a high voltage level and a low voltage level.

The semiconductor memory device comprises a memory cell array 11 implemented by a plurality of memory cells M11 to M1$n$, ... and Mm1 to Mmn, and the memory cells M11 to Mmn store data bits in the form of potential difference at respective memory node pairs (not shown).

The memory cells M11 to Mmn are arranged in rows and columns, and a plurality of bit line pairs BLP1 to BLPn are associated with the respective columns of memory cells M11 to Mm1, ... and M1$n$ to Mmn. Each of the bit line pairs BLP1 to BLPn is implemented by first and second bit lines BLa and BLb, and the memory node pairs of the memory cells M11 to Mmn are connectable with the associated first and second bit lines BLa and BLb.

Though not shown in the drawings, the memory cells M11 to Mmn are of a static random access type, and each memory cell comprises two series combinations of resistors, the memory nodes and switching transistors coupled in parallel between a positive power voltage line and a ground voltage line and two transfer transistors respectively coupled between the associated first and second bit lines BLa and BLb and the memory nodes. The gate electrode of the switching transistor in one of the series combinations is coupled with the memory node of the other of the series combinations. One of the switching transistors is turned on, and the other switching transistor is turned off. Therefore, a data bit is stored as a potential difference between the memory nodes.

The semiconductor memory device further comprises an addressing system broken down into a row addressing sub-system and a column addressing sub-system. The row addressing sub-system 12 has a row address decoder (not shown), a plurality of word line drivers 121 to 12$m$ and a plurality of word lines WL1 to WLm. The row address decoder decodes address bits indicative of a row address, and supplies row address decoded signals to the word line drivers 121 to 12$m$. The word lines WL1 to WLm are respectively associated with the rows of memory cells M11 to M1$n$, ... and Mm1 to Mmn, and are connected with the control nodes of the associated memory cells M11 to Mmn. The gate electrodes of the transfer transistors serves as the control nodes. Row addresses are respectively assigned to the word lines WL1 to WLm. An enable signal EBL allows the word line drivers 121 to 12$m$ to become responsive to the row address decoded signals, and one of the word line drivers 121 to 12$m$ energizes the word line assigned the row address indicated by the address bits.

The column addressing sub-system 13 has a column address decoder (not shown) and a column selector 13$a$, and the column address decoder decodes address bits indicative of a column address. The column address decoded signals thus produced are supplied from the column address decoder the column selector 13a, and the column selector 13a selects one of the bit line pairs BLP1 to BLPn assigned the column address indicated by the address bits.

The semiconductor memory device further comprises a pull-up/balancing unit 14 coupled between a positive power voltage line VDD and the plurality of bit line pairs BLP1 to BLPn and a plurality sets of p-channel enhancement type load transistors Qp11 and Qp12 coupled between the positive power voltage line VDD and the bit line pairs BLP1 to BLPn.

The pull-up/balancing unit 14 is responsive to a one-shot precharge controlling signal PCH of active low voltage level, and charges the bit line pairs BLP1 to BLPn to the positive power voltage level Vdd while the one-shot precharge controlling signal PCH is staying in the active low voltage level. As will be described hereinlater, the duty ratio of the one-shot precharge control signal PCH is variable.

The ground voltage level is supplied to the gate electrodes of the plurality sets of p-channel type load transistors Qp11 and Qp12, and supplies current from the positive power voltage line VDD and the bit line pairs BLP1 to BLPn at all times. For this reason, even if selected memory cells provide respective current paths each coupling one of the memory nodes with a ground voltage line, the p-channel type load transistors Qp11 and Qp12 keep the associated bit lines BLa or BLb at a predetermined voltage level 0.2 volt lower than the positive power voltage level Vdd.

In this instance, the pull-up/balancing unit 14 and the plurality sets of p-channel type load transistors Qp11 and Qp12 as a whole constitute a precharging means, and the predetermined voltage level 0.2 volt lower than the positive power voltage level serves as a middle voltage level.

The semiconductor memory device further comprises a read/write circuit 15, an address transition detecting circuit 16 and a timing controller 17. The read/write circuit 15 is coupled with the column selector 13a, and is responsive to a write-enable signal WE for changing the semiconductor memory device between the write-in mode and the read-out mode. Namely, if the write enable signal WE is in an active level, the read/write circuit 15 produces a potential difference indicative of a write-in data bit, and supplies the potential difference through the column selector 13a to the selected bit line pair. The read/write circuit keeps the first and second bit lines BLa and BLb at the positive high voltage level Vdd and the ground voltage level or vice versa in spite of the associated set of p-channel type load transistors Qp11 and Qp12 in the write-in sequence.

On the other hand, if the write-in enable signal WE is in an inactive level, the read/write circuit 15 produces an output data signal indicative of a read-out data bit from a potential difference supplied from the selected bit line pair.

The address transition detecting circuit 16 monitors the address bits, and produces a one-shot address transition detecting signal ATD when at least one address bit is changed. While the address transition detecting circuit 16 is keeping the address transition detecting signal ATD in an active low voltage level, the term defined by the address transition detecting signal ATD in the active low voltage level is referred to as "an address transition period".

The timing controller 17 comprises a plurality of timing controlling circuits 171 to 17n respectively associated with the bit line pairs BLP1 to BLPn, and the timing controlling circuits 171 to 17n are similar in arrangement to one another. Each of the timing controlling circuits 171 to 17n produces the enable signal EBL and the precharge controlling signal PCH, and every enable signal EBL and every precharge controlling signal PCH respectively take effect on the pull-up/balancing unit 14 and on the word line drivers 121 to 12m. For this reason, only the timing controlling circuit 171 is described hereinbelow.

The timing controlling circuit 171 largely comprises a first voltage comparator 171a, a second voltage comparator 171b, a reference voltage producing circuit 171c, an activation circuit 171d and a signal generator 171e.

The reference voltage producing circuit 171c is implemented by a series combination of a resistor string R1/R2 and an n-channel enhancement type switching transistor Qn13, and the resistor string has a reference node RF between the resistors R1 and R2. The resistor string R1/R2 is powered with the positive power voltage level Vdd, and the n-channel enhancement type switching transistor Qn13 turns on in the presence of an activation signal ACT supplied from the activation circuit 171d.

While the n-channel enhancement type switching transistor Qn13 is turned on, the resistor string R1/R2 produces a reference voltage Vref. The ratio between the resistances r1 and r2 of the resistors R1 and R2 and the channel resistance r13 of the n-channel enhancement type switching transistor Qn13 is adjusted as $r1/0.2:(r2+r13)/(Vdd-0.2)$, and the reference voltage Vref is regulated to the predetermined voltage level 0.2 volt lower than the positive power voltage level Vdd.

The activation circuit 171d is implemented by a two-input NAND gate NA1, and the address transition signal ATD and the enable signal EBL are supplied to the respective input nodes of the NAND gate NA1 for producing the activation signal ACT.

The first voltage comparator 171a is implemented by a current mirror circuit, and comprises a series combination of a p-channel enhancement type load transistor Qp14 and an n-channel enhancement type variable load transistor Qn15 coupled between the positive power voltage line VDD and a common node, a series combination of a p-channel enhancement type variable load transistor Qp16 and an n-channel enhancement type variable load transistor Qn17 also coupled between the positive power voltage line VDD and the common node and an n-channel enhancement type switching transistor Qn18 coupled between the common node and the ground voltage line. The n-channel enhancement type variable load transistors Qn15 and Qn17 are respectively gated by the first bit line BLa of the associated bit line pair BLP1 and with the reference voltage Vref. The gate electrodes of the p-channel enhancement type variable load transistors Qp14 and Qp16 are coupled with the drain node of the p-channel enhancement type variable load transistor Qp14, and the drain node of the p-channel enhancement type variable load transistor Qp16 serves as an output node of the first voltage comparator 171a assigned to a first ready signal OUT1 indicative of the arrival of the first bit line BLa at the predetermined voltage level or the reference voltage Vref.

The second voltage comparator 171b is also implemented by a current mirror circuit, and comprises a series combination of a p-channel enhancement type load transistor Qp19 and an n-channel enhancement type variable load transistor Qn20 coupled between the positive power voltage line VDD and a common node, a series combination of a p-channel enhancement type variable load transistor Qp21 and an n-channel enhancement type variable load transistor Qn22 also coupled between the positive power voltage line VDD and the common node and an n-channel enhancement type switching transistor Qn23 coupled between the common node and the ground voltage line. The n-channel enhancement type variable load transistors Qn20 and Qn22 are respectively gated by the second bit line BLb of the associated bit line pair BLP1 and with the reference voltage Vref. The gate electrodes of the p-channel enhancement type variable load transistors Qp19 and Qp20 are coupled with the drain node of the p-channel enhancement type variable load transistor Qp19, and the drain node of the p-channel enhancement type variable load transistor Qp22 serves as an output node of the second voltage comparator 171b assigned to a second ready signal OUT2 indicative of the arrival of the second bit line BLb at the predetermined voltage level or the reference voltage Vref.

In this instance, the timing controlling unit 17 and the address transition detecting circuit 16 as a whole constitute a timing control means.

The first and second voltage comparators 171a and 171b similarly behave. Namely, while the voltage level on the associated bit line BLa or BLb is lower than the reference voltage level Vref, the p-channel enhancement type variable load transistor is large in channel resistance, and the first or second ready signal is in inactive low voltage level. However, when the associated bit line BLa or BLb exceeds the reference voltage level Vref, the n-channel enhancement type variable load transistor Qn15 or Qn20 is decreased in channel resistance, and the common drain node between the variable load transistors Qp14/Qp19 and Qn15/Qn20 decreases the channel resistances of the p-channel enhancement type variable load transistors Qp14/Qp16 or Qp19/Qp21. As a result, the p-channel enhancement variable load transistor Qp16 or Qp21 increases the voltage level at the drain node thereof, and, accordingly, shifts the first or second ready signal to the high voltage level.

The signal generator 171e comprises a two-input NAND gate NA2 supplied with the first and second ready signals OUT1 and OUT2, an inverter IV1 having an input node coupled with the output node of the NAND gate NA2 for producing the enable signal EBL and an AND gate supplied with the enable signal EBL and the one-shot address transition detecting signal ATD for producing the precharge control signal PCH.

The enable signal EBL is further supplied to the word line drivers 121 to 12m, and enables the word line drivers 121 to 12m so as to become responsive to the row address decoded signals. While the enable signal EBL is in the high voltage level, the enable signal EBL is active.

While the precharge control signal PCH is in the low voltage level, the precharge control signal PCH is active, and causes the pull-up/balancing unit 14 to charge the bit line pairs BLP1 to BLPn to the power voltage level Vdd.

Figure 4:
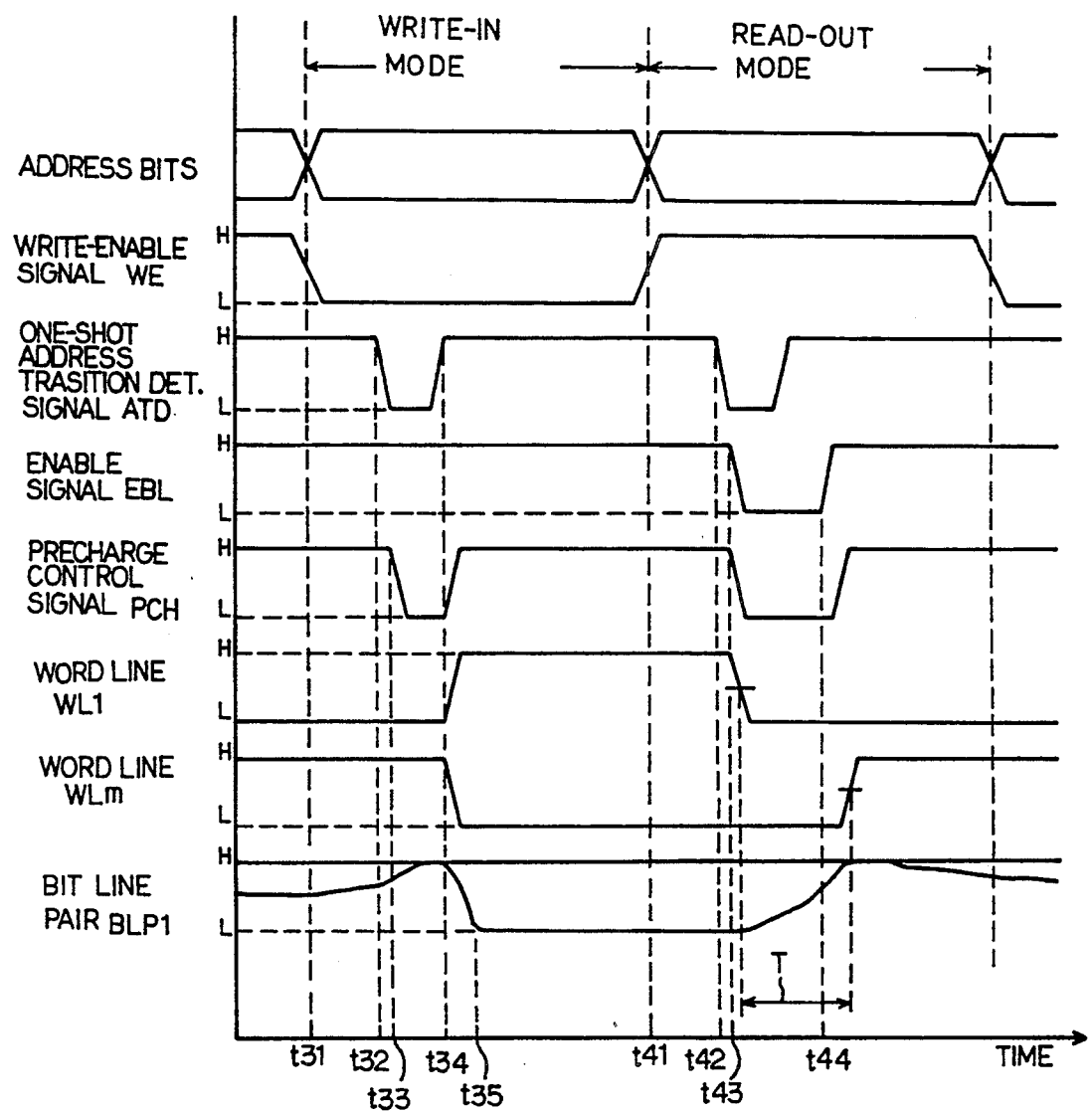
FIG. 4 is a timing chart showing a write-in sequence and a read-out sequence carried out by the semiconductor memory device shown in FIG. 3.

The semiconductor memory device thus arranged behaves as follows. Assuming now that the write enable signal WE goes down to the low voltage level indicative of the write-in mode at time t31 as shown in FIG. 4, at least one address bit is changed, and the address transition detecting circuit 16 produces the one-shot address transition detecting signal ATD of the low voltage level at time t32. The address bits are assumed to select the row address assigned to the word line WL1 and the bit line pair BLP1.

Since the enable signal EBL remains in the active high voltage level, the AND gate AD1 shifts the precharge control signal PCH to the active low voltage level at time t33, and the pull-up/balancing unit 14 starts to charge all of the first and second bit lines BLa and BLb toward the positive power voltage level Vdd.

With the one-shot address transition detecting signal ATD, the NAND gate NA1 supplies the activation signal ACT of the high voltage level to the gate electrodes of the n-channel enhancement type switching transistors Qn18, Qn23 and Qn13. Then, the reference voltage producing circuit 171c starts to produce the reference voltage Vref, and the first and second voltage comparators 171a and 171b starts to monitor the first and second bit lines BLa and BLb of the associated bit line pair.

In the write-in sequence immediately after a read-out sequence, both first and second bit lines BLa and BLb are not lower than the predetermined voltage level equal to the reference voltage level Vref, and the first and second voltage comparators 171a and 171b keep the first and second ready signals OUT1 and OUT2 in the high voltage level or logic "1" level. In this situation, the NAND gate NA2 continuously yields the output signal of logic "0" level, and the inverter IV1 keeps the enable signal EBL in logic "1" level or the high voltage level. For this reason, the word line drivers 121 to 12m are responsive to the row address decoded signals at all times.

If the one-shot address transition detecting signal ATD is recovered to the high voltage level at time t34, the AND gate AD1 shifts the precharge control signal PCH to the inactive high voltage level, and the pull-up/balancing circuit 14 completes the charging operation on the bit line pairs BLP1 to BLPn.

When the one-shot address transition detecting signal ATD is recovered to the high voltage level, the NAND gate NA1 shifts the activation signal ACT to the inactive low voltage level, and the n-channel enhancement type switching transistors Qn18, Qn23 and Qn13 turn off. However, the first and second ready signals OUT1 and OUT2 are maintained at the high voltage level, and the NAND gate NA2 continuously produces the output signal of logic "0" level.

Moreover, the row address decoded signals are supplied to the word line drivers 121 to 12m, and word line driver 121 charges the word line WL1, and the word line driver 12m discharges the word line WLm. Then, the memory cells M11 to M1n are conducted to the associated bit line pairs BLP1 to BLPn, respectively.

The column selector 13a couples the bit line pair BLP1 with the read/write circuit 15, and the read/write circuit 15 supplies a potential difference indicative of a write-in data bit to the bit line pair BLP1. Since the positive high voltage level Vdd and the ground voltage level form the potential difference indicative of the write-in data bit, one of the first and second bit lines BLa and BLb is pulled down to the ground voltage level at time t35, and the other bit line is maintained at the positive high voltage level Vdd.

If the write enable signal WE is changed to the high voltage level at time t41, the semiconductor memory device enters into the read-out mode. The address bits are assumed to select the bit line pair BLP1 and the word line WLm.

The address transition detecting circuit 16 acknowledges the address transition, and starts to produce the one-shot address transition detecting signal ATD at time t42. With the address transition detecting signal ATD of the active low voltage level, the NAND gate NA1 shifts the activation signal ACT to the active high voltage level, and the reference voltage producing circuit 171c and the first and second voltage comparators 171a and 171b are activated again.

The one-shot address transition detecting signal ATD of the low voltage level causes the AND gate AD1 to shift the precharge control signal PCH to the active low voltage level at time t43, and the pull-up/balancing circuit 14 starts to change all of the bit line pairs BLP1 to BLPn toward the positive power voltage level Vdd.

In the read-out sequence immediately after the write-in sequence, either bit line BLa or BLb of each bit line pair remains in the ground voltage level, and the other bit line is in the positive power voltage level Vdd. Therefore, one of the voltage comparators 171a and 171b shifts the ready signal to the low voltage level, and the other voltage comparator yields the ready signal of the high voltage level. For this reason, the NAND gate NA2 changes the output signal to the high voltage level, and the inverter shifts the enable signal EBL to the inactive low voltage level. The enable signal EBL of the low voltage level does not allow the word line drivers 121 to 12m to respond to the row address decoded signals.

While the enable signal EBL of the inactive low voltage level is disabling the word line drivers 121 to 12m, the pull-up/balancing circuit 14 pulls up the bit lines from the ground voltage level to the positive power voltage level Vdd.

If the bit lines exceeds the predetermined voltage level equal to the reference voltage level Vref at time t44, the voltage comparator shifts the ready signal from the low voltage level to the high voltage level, and both ready signals OUT1 and OUT2 become high. As a result, the NAND gate NA2 shifts the output signal to the low voltage level, and the inverter IV1 starts to change the enable signal EBL to the active high voltage level at time t44.

The one-shot address transition detecting signal ATD has been already recovered to the inactive high voltage level, and the enable signal EBL of the active high voltage level causes the AND gate AD1 to change the precharge control signal PCH to the inactive high voltage level.

Even if the row address decoded signals reach the word line drivers at time t43, the word line driver 12m does not charge the selected word line WLm until the enable signal EBL is changed to the active high voltage level. However, the word line driver 121 discharges the non-selected word line WL1 at time t43. A switching transistor gated by the enable signal EBL may be coupled between a power supply line and the word line drivers 121 to 12m so as to achieve the selective operation.

The selected word line WLm allows the memory cells Mm1 to Mmn to produce potential differences on the associated bit line pairs BLP1 to BLPn, and one of the first and second bit lines BLa and BLb of each pair is decayed to the predetermined voltage level 0.2 volt lower than the positive power voltage level Vdd. The column selector 13a transfers the potential difference on the bit line pair BLP1 to the read/write circuit 15, and the read/write circuit 15 produces an output data signal from the potential difference indicative of the data bit read out from the memory cell M1m.

As will be appreciated from the foregoing description, the timing control unit 17 prohibits the selected word line from energizing until both first and second bit lines sufficiently rise, and the prohibiting period T prevents the data bits stored in the memory cells from undesirable destruction.

Second Embodiment

Figure 5:
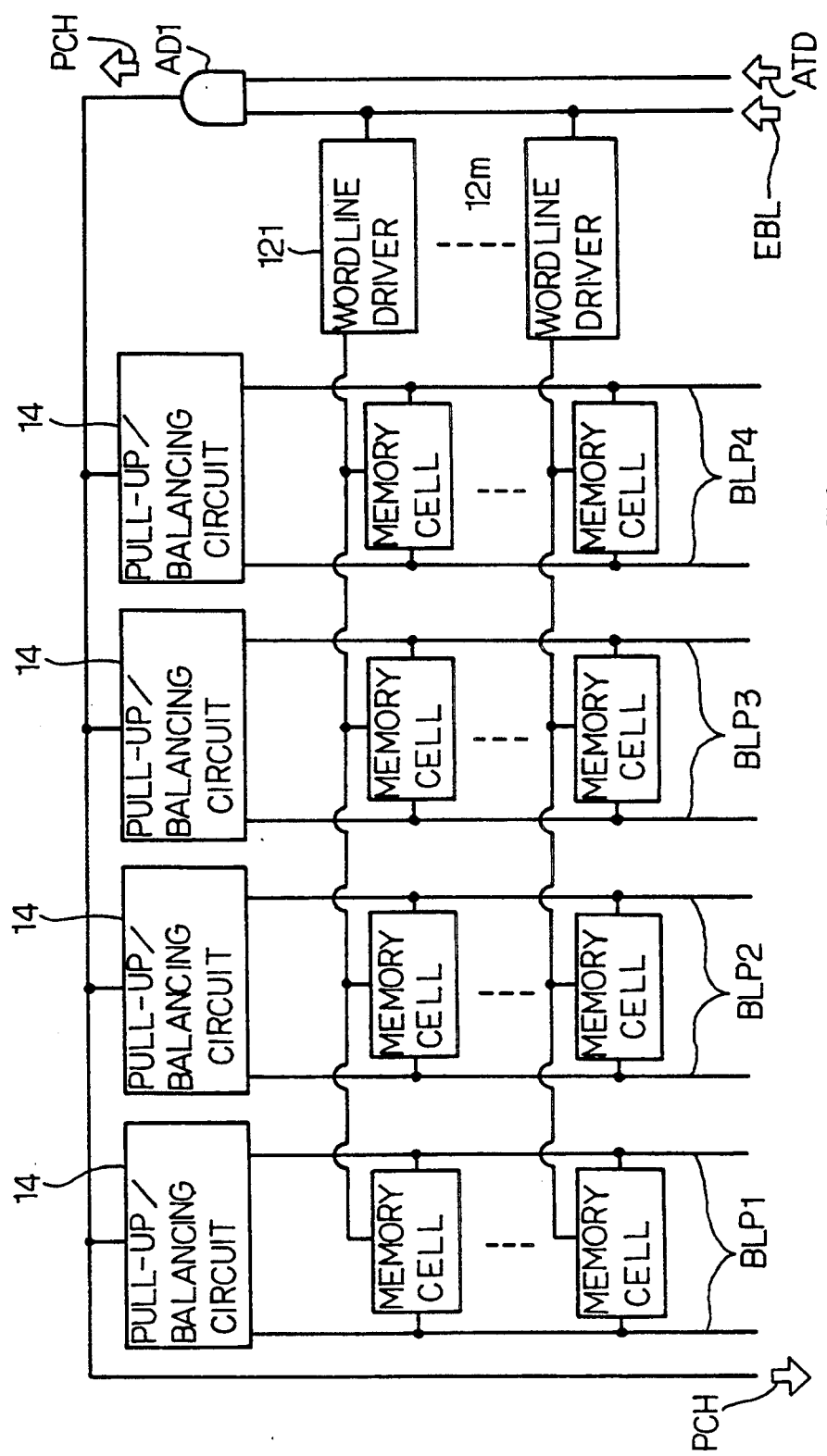
FIG. 5 is a block diagram showing the circuit arrangement an essential part of another semiconductor memory device according to the present invention.
Figure 6:
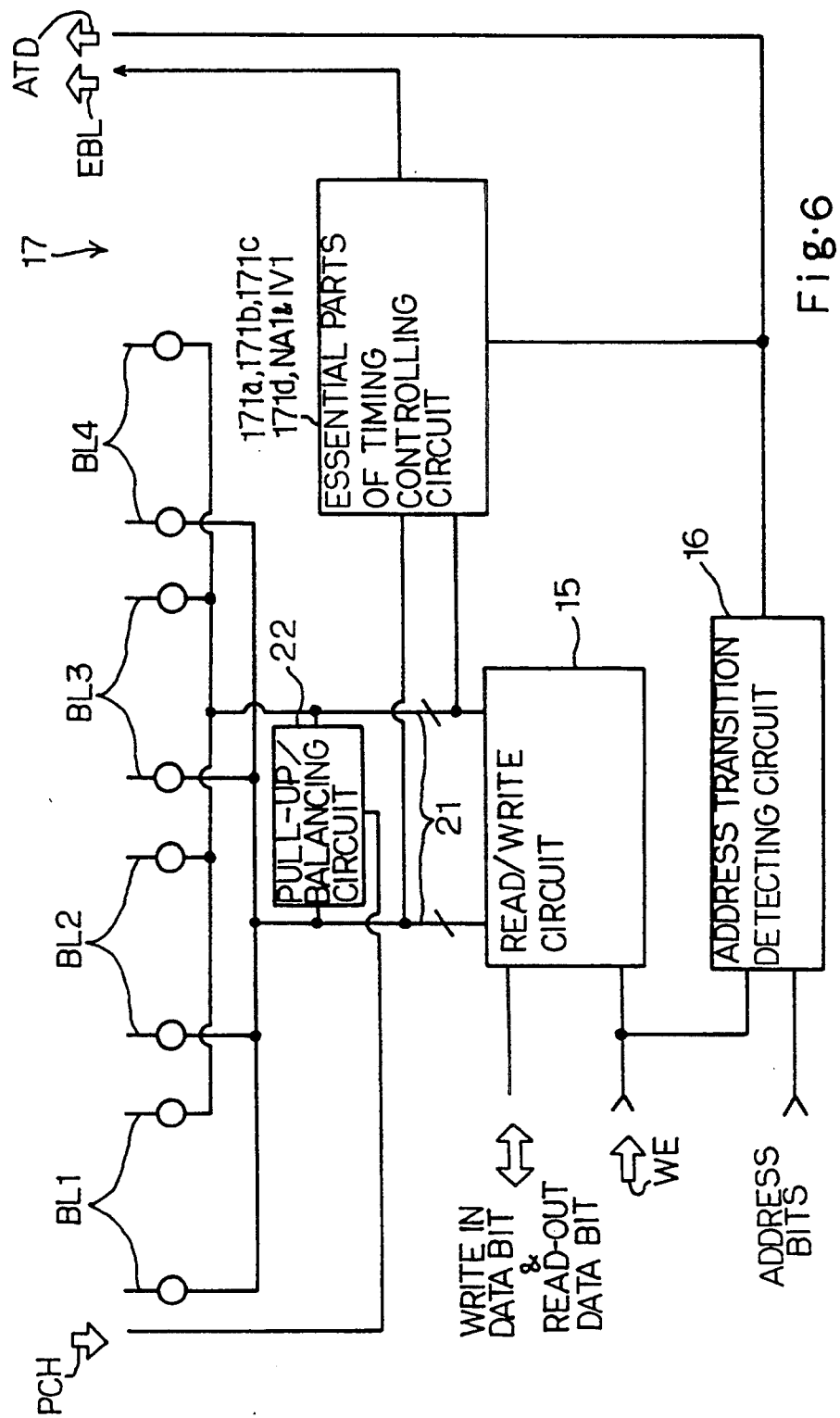
FIG. 6 is a block diagram showing the circuit arrangement of another essential part contiguous to the essential part shown in FIG. 5.

Turning to FIGS. 5 and 6 of the drawings, another semiconductor memory device embodying the present invention is illustrated. In the semiconductor memory device shown in FIGS. 5 and 6, every four bit line pairs BLP1 to BLP4 are grouped, and the four bit line pairs BLP1 to BLP4 are selectively coupled through a selector (not shown) to a data but 21. For this reason, an additional pull-up/balancing circuit 22 is coupled with the data bus 21 between the selector and a read/write circuit 15, and a timing controlling circuit monitors the data bus 21. The same references in FIGS. 5 and 6 designates the circuit components corresponding to those of the first embodiment, and the advantages of the first embodiment are also achieved.

Although particular embodiments of the present invention have been shown and described, it will be obvious to those skilled in the art that various changes and modifications may be made without departing from the spirit and scope of the present invention. For example, the activation circuit 171d and the reference voltage producing circuit 171c may be shared between all of the timing control circuits.

What is claimed is:

1. A semiconductor memory device selectively entering into a write-in mode and a read-out mode, comprising:
    a) a memory cell array having a plurality of memory cells each storing a data bit in the form of potential difference;
    b) a plurality of bit line pairs selectively associated with said plurality of memory cells, and connected with data transfer node pairs of the associated memory cells, each of said plurality of bit line pairs having a first bit line and a second bit line;
    c) a plurality of word lines selectively associated with said plurality of memory cells, and connected with control nodes of the associated memory cells;
    d) a word line driving unit connected with said plurality of word lines, and enabled with an enable signal for energizing one of said plurality of word lines, thereby allowing data bits in the form of potential difference to be transferred between said plurality of bit line pairs and the memory cells coupled with said one of said plurality of word lines;
    e) a read/write circuit connectable with one of said plurality of bit line pairs, and supplying a potential difference indicative of a write-in data bit to said one of said plurality of bit line pairs in said write-in mode, a high voltage level and a low voltage level forming said potential difference indicative of said write-in data bit, said read/write circuit producing an output data signal indicative of one of said data bits read out from said memory cell array in said read-out mode, said high voltage level and a middle voltage level forming said potential difference indicative of said one of said data bits;

f) a precharging means responsive to a precharge control signal for charging said plurality of bit line pairs to said high voltage level, said precharging means being further operative to keep either first or second bit line of each bit line pair at said middle voltage level in said read-out mode after said one of said word lines is energized; and g) a timing control means activated in a transition period after an address transition, and monitoring said plurality of bit line pairs to see whether or not said precharging means causes said first bit lines and said second bit lines to exceed said middle voltage level in at least said read-out mode for producing said enable signal and said precharge control signal, said enable signal being produced when either first or second bit line of each bit line pair exceeds said middle voltage level after said address transition, said precharge control signal being canceled when either first or second bit line of each bit line pair exceeds said middle voltage level after said address transition.

2. The semiconductor memory device as set forth in claim 1, in which said timing control means comprises an address transition detecting circuit for producing a one-shot address transition detecting signal when said address transition takes place, and a timing control unit responsive to said one-shot address transition detecting signal, and monitoring said plurality of bit line pairs to see whether or not said precharging means causes said first bit lines and said second bit lines to exceed said middle voltage level in at least said read-out mode for producing said enable signal and said precharge control signal, said enable signal being produced when either first or second bit line of each bit line pair exceeds said middle voltage level after said address transition, said precharging control signal being canceled when either first or second bit line of each bit line pair exceeds said middle voltage level after said address transition.

3. The semiconductor memory device as set forth in claim 2, in which said timing control unit comprises a timing control circuit associated with one of said plurality of bit line pairs and having an activation circuit responsive to said one-shot address transition detecting signal for producing an activation signal, and canceling said activation signal in the presence of said enable signal after said one-shot address transition detecting signal is removed, a reference voltage producing circuit responsive to said activation signal for producing a reference voltage equal to said middle voltage level, a first voltage comparator having a first input node coupled with said first bit line of said one of said plurality of bit line pairs and a second input node supplied with said reference voltage, and operative to produce a first ready signal when said first bit line exceeds said reference voltage, a second voltage comparator having a first input node coupled with said second bit line of said one of said plurality of bit line pairs and a second input node supplied with said reference voltage, and operative to produce a second ready signal when said second bit line exceeds said reference voltage, and a signal producing circuit responsive to said first and second ready signals for producing said enable signal and said precharge controlling signal.

4. The semiconductor memory device as set forth in claim 3, in which said activation circuit is implemented by a NAND gate having a first input node supplied with said one-shot address transition detecting signal of an active low level and a second input node supplied with said enable signal of an active high level and operative to produce said activation signal of said active high level.

5. The semiconductor memory device as set forth in claim 3, in which each of said first and second voltage comparators comprises a series combination of a first enhancement type variable load transistor of a first channel conductivity type, a first common drain node and a second enhancement type variable load transistor of a second channel conductivity type coupled between a first source of power voltage level and a common node, said second channel conductivity type being opposite to said first channel conductivity type, one of said first and second bit lines being connected with a gate electrode of said second enhancement type variable load transistor, a series combination of a third enhancement type variable load transistor of said first channel conductivity type, a second common drain node and a fourth enhancement type variable load transistor of said second channel conductivity type coupled between said first source of power voltage level and said common node, said first common drain node being connected with gate electrodes of said first and third enhancement type variable load transistors, said reference voltage being supplied to a gate electrode of said fourth enhancement type variable load transistor, one of said first and second ready signals being producing at said second common drain node, and an enhancement type switching transistor of said second channel conductivity type coupled between said common node and a second source of power voltage level different in voltage level from said first source of power voltage level, said activation signal being supplied to a gate electrode of said enhancement type switching transistor.

6. The semiconductor memory device as set forth in claim 3, in which said reference voltage producing circuit comprises a resistor string connected at one end thereof with a first source of power voltage level, and having a reference node for producing said reference voltage, and an enhancement type switching transistor connected between the other end of said resistor string and a second source of power voltage level different in voltage level from said second source of power voltage level, and having a gate electrode supplied with said activation signal.

7. The semiconductor memory device as set forth in claim 3, in which said signal producing circuit comprises a NAND gate having a first input node supplied with said first ready signal and a second node supplied with said second ready signal, an inverter having an input node connected with an output node of said NAND gate for producing said enable signal, and an AND gate having a first input node connected with an output node of said inverter and a second input node supplied with said one-shot address transition detecting signal.

8. The semiconductor memory device as set forth in claim 2, in which said timing control unit has a timing control circuit associated with a predetermined number of bit line pairs selected from said plurality of bit line pairs.

9. A semiconductor memory device comprising:

a plurality of memory cells;

bit lines paired with each other and coupled with said plurality of memory cells;

a pull-up and balancing circuit for pulling up and balancing said bit lines;

a word line selecting circuit for making said plurality of memory cells accessible;

a write and read circuit operative to write data information into and read said data information from said plurality of memory cells;

a one-shot pulse producing circuit for producing a one-shot pulse when an address is changed; and a controlling means operative to detect a potential difference between said bit lines upon transition from a write-in mode to a read-out mode, and responsive to said one-shot pulse for controlling said pull-up and balancing circuit and said word line selecting circuit.

* * * * *